United States Patent [19]

Hase et al.

[11] Patent Number: 5,436,491
[45] Date of Patent: Jul. 25, 1995

[54] PRESSURE SENSOR FOR HIGH TEMPERATURE VIBRATION INTENSE ENVIRONMENT

[75] Inventors: Yuji Hase; Mikio Bessho, both of Amagasaki, Japan

[73] Assignee: Mitsubishi Denki Kabushiki Kaisha, Tokyo, Japan

[21] Appl. No.: 135,410

[22] Filed: Oct. 13, 1993

[30] Foreign Application Priority Data

Oct. 19, 1992 [JP] Japan .................... 4-279635

[51] Int. Cl.⁶ .................................. H01L 29/84
[52] U.S. Cl. ........................ 257/417; 257/419; 257/687; 73/721; 73/726; 73/727; 73/756
[58] Field of Search ............. 257/415, 417, 419, 420, 257/701, 687; 73/777, 720, 726, 721, 727, 754, 756

[56] References Cited

U.S. PATENT DOCUMENTS

| | | | |
|---|---|---|---|
| 4,942,383 | 7/1990 | Lam et al. | 73/720 |
| 5,161,415 | 11/1992 | Kodama et al. | 73/708 |
| 5,209,120 | 5/1993 | Araki | 73/721 |
| 5,212,989 | 5/1993 | Kodama et al. | 73/706 |
| 5,222,397 | 6/1993 | Kodama | 73/756 |
| 5,266,827 | 11/1993 | Kato | 257/417 |

FOREIGN PATENT DOCUMENTS

| | | | |
|---|---|---|---|
| 0386959 | 9/1990 | European Pat. Off. | 73/727 |
| 8105868 | 7/1981 | Germany | 73/727 |
| 241476 | 12/1986 | Germany | 73/727 |
| 4201634 | 8/1992 | Germany | 73/727 |
| 4203832 | 8/1992 | Germany | 73/727 |
| 55-43819 | 3/1980 | Japan | 257/415 |
| 57-96574 | 6/1982 | Japan | 257/417 |
| 57-204176 | 12/1982 | Japan | 257/415 |
| 60-55672 | 3/1985 | Japan | 257/415 |
| 60-128674 | 7/1985 | Japan | 257/417 |
| 62-144368 | 6/1987 | Japan | 257/419 |
| 4-76961 | 3/1992 | Japan | 257/419 |
| 4-113681 | 4/1992 | Japan | 257/417 |
| 4-114478 | 4/1992 | Japan | 257/417 |
| 4-240777 | 8/1992 | Japan | 257/417 |

OTHER PUBLICATIONS

Mebtechnik, Electronik 16 Schwerpunkt, "Ein Sensor für Druck und Temperatur", Aug. 7, 1987, pp. 74–77.
Society of Automotive Engineers of Japan, Inc., Oct. 1992, vol. 3, No. 924126, Ueda et al., "Combustion Pressure Sensor for Toyota Lean Burn Engine Control", pp. 53–56.

*Primary Examiner*—William Mintel
*Assistant Examiner*—Minhloan Tran
*Attorney, Agent, or Firm*—Sughrue, Mion, Zinn, Macpeak & Seas

[57] ABSTRACT

A pressure sensor includes an electrically insulating material covering wires for transmitting an electrical signal generated by a semiconductor pressure-sensing unit, the joints between the wires and the pressure-sensing unit, and the joints between the wires and leads connected to the wires for leading the electrical signal to the outside of the body casing of the sensor. Thus, detection of pressure is possible even in an intense-vibration environment, and it is also possible to reduce influences by changes in temperature.

9 Claims, 5 Drawing Sheets

PRESSURE SENSOR FOR HIGH TEMPERATURE VIBRATION INTENSE ENVIRONMENT

BACKGROUND OF THE INVENTION

1. Field of the Invention

The present invention relates to a pressure sensor, and more particularly, to a pressure sensor for sensing pressure in a high-temperature intense-vibration environment, such as combustion pressure of an engine.

2. Description of the Related Art

FIG. 7 schematically shows, in a sectional view, a conventional pressure sensor disclosed, for example, in Japanese Patent Laid-Open No. 4-76961. Referring to the drawing, the pressure sensor includes a cylindrical body casing 1 made of stainless steel or a like material. The body casing 1 has an opening portion 1a, on which is sealed a metal diaphragm 2 capable of deforming when subjected to pressure from the outside of the sensor. The metal diaphragm 2 is made of a stainless steel material with a thickness of approximately 100 to 150 μm. A sealing member 4 is sealed to a portion of the inner surface 1b of the body casing 1 by a welding method or the like, and has a sealing portion 4a between that portion of the inner surface 1b and the main portion of the sealing member 4. The sealing member 4 cooperates with the body casing 1 and the metal diaphragm 2 to define a space within the body casing 1, in which space, a non-compressible medium 3 is sealed to maintain an air-tight condition in the space. A base 5 of the pressure sensor is formed of glass or a like material.

A semiconductor pressure-sensing unit 6 is disposed in the space and supported by the sealing member 4 through the base 5. When the metal diaphragm 2 deforms, the semiconductor pressure-sensing unit 6 is subjected to a corresponding pressure. The semiconductor pressure-sensing unit 6 has a semiconductor diaphragm 6a which receives such a pressure and undergoes a deformation in accordance with the received pressure. A strain gauge 7 is formed on one of the major surfaces of the semiconductor pressure-sensing unit 6 which opposes the metal diaphragm 2, and is capable of outputting an electrical signal in accordance with a deformation of the semiconductor diaphragm 6a. Leads 9 have upper portions 9a for receiving an electrical signal output by the strain gauge 7 and transmitted through wires 8, so as to lead the electrical signal to an external circuit (not shown). The strain gauge 7 has a circuit configuration shown in FIG. 8. As shown in FIG. 8, a plurality of strain-sensitive elements 7a, which are, for example, bridge-connected together, constitute the strain gauge 7.

The operation of the conventional pressure sensor will be described.

When a pressure A from the outside of the sensor acts on the metal diaphragm 2, as indicated by arrows in FIG. 7, the metal diaphragm 2 is accordingly deformed. Since an air-tight condition is maintained in the space within the body casing 1 by sealing the non-compressible medium 3 therein, the deformation of the metal diaphragm 2 causes a corresponding pressure to be applied to the semiconductor diaphragm 6a through the non-compressible medium 3, thereby causing a corresponding deformation of the semiconductor diaphragm 6a.

The strain gauge 7 senses the deformation of the semiconductor diaphragm 6a, and outputs an electrical signal of a magnitude corresponding to the magnitude of the deformation of the semiconductor diaphragm 6a, which signal is delivered to the external circuit.

The external circuit recognizes the magnitude of the pressure A on the basis of the signal output from the strain gauge 7.

When the conventional pressure sensor is subjected to intense vibration, disconnection may occur in the wires 8, or the wires 8 may be separated from the semiconductor pressure-sensing unit 6, thereby making it impossible to deliver electrical signals to the external circuit.

SUMMARY OF THE INVENTION

The present invention has been made in view of the above-described problem. An object of the present invention is to provide a pressure sensor capable of detecting pressure even in environments involving intense vibration, and thus capable of exhibiting high reliability.

According to one aspect of the present invention, there is provided a pressure sensor comprising: a body casing having an opening portion formed with an opening therethrough; a metal diaphragm sealed on the outer end of the opening portion of the body casing, the metal diaphragm being capable of deforming when subjected to pressure from the outside of the pressure sensor; a non-compressible medium sealed contacting inner surfaces of the body casing; a sealing member cooperating with the metal diaphragm to seal the inside of the body casing; a base mounted on the sealing member; a semiconductor pressure-sensing unit mounted on the base, the semiconductor pressure-sensing unit having a semiconductor diaphragm for receiving pressure through the non-compressible medium when the metal diaphragm deforms, and for deforming in accordance with the received pressure, the semiconductor pressure-sensing unit also having a strain gauge for outputting an electrical signal indicating such a deformation of the semiconductor diaphragm; wires for transmitting an electrical signal from the semiconductor pressure-sensing unit; leads connected with the wires for leading the electrical signal to the outside of the body casing of the sensor; and an electrically insulating material covering the wires per se, the joints between the wires and the semiconductor pressure-sensing unit, and the joints between the wires and the leads.

According to another aspect of the present invention, there is provided a pressure sensor comprising: a body casing having an opening portion formed with an opening therethrough; a metal diaphragm sealed on the outer end of the opening portion of the body casing, the metal diaphragm being capable of deforming when subjected to pressure from the outside of the pressure sensor; a sealing member disposed on the inner end of the opening portion of the body casing and opposed to the metal diaphragm, the sealing member having an opening formed therethrough; a base disposed on the sealing member and having an opening formed therethrough; a semiconductor pressure-sensing unit having a semiconductor diaphragm on one side thereof and a strain gauge on the other, the semiconductor pressure-sensing unit being disposed on the base with the semiconductor diaphragm opposed to the metal diaphragm; a non-compressible medium sealed contacting inner surfaces of the body casing in a space defined by the body casing, the sealing member and the base; wires for transmitting an electrical signal from the semiconductor pressure-sensing unit; leads connected with the wires for leading the electrical signal to the outside of the body casing of the sensor; and an electrically insulating material covering the wires per se, the joints between the wires and the semiconductor pressure-sensing unit, and the joints between the wires and the leads.

DESCRIPTION OF THE PREFERRED EMBODIMENTS

Figure 1:
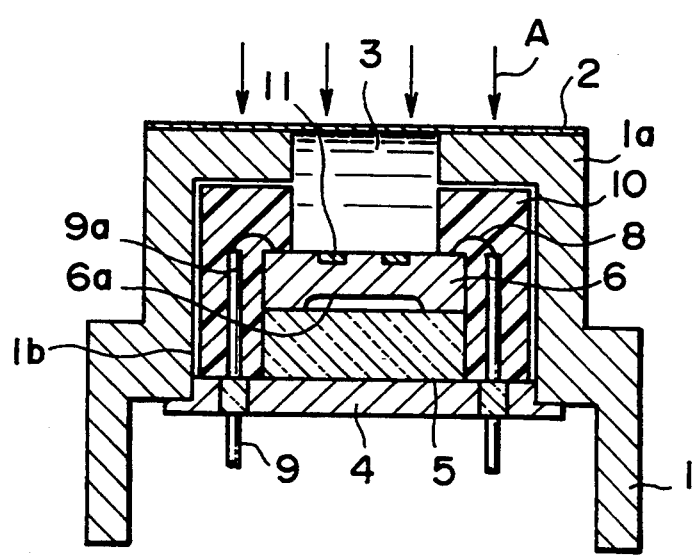
FIG. 1 is a vertical sectional view schematically showing a pressure sensor according to a first embodiment of the present invention.

FIG. 1 schematically shows, in a vertical sectional view, a pressure sensor according to a first embodiment of the present invention. In FIG. 1, components which are the same as or correspond to those of the conventional sensor are denoted by reference numerals identical to those used for the conventional sensor. Referring to FIG. 1, the sensor according to this embodiment includes an electrically insulating material 10 which covers wires 8 themselves, the joints between the wires 8 and a semiconductor pressure-sensing unit 6, and the joints between the wires 8 and leads 9. In this embodiment, the semiconductor pressure-sensing unit 6, the wires 8 and the leads 9, all within a body casing 1 of the pressure sensor, are molded with an electrically insulating material 10, such as an epoxy resin, which thus forms a molding portion. The molding portion is formed in such a manner that the upper side of the semiconductor pressure-sensing unit 6 (the side thereof constituting a semiconductor diaphragm 6a) and a strain gauge 11 of the unit 6 are not covered by the electrically insulating material 10 when viewed from the direction in which pressure is applied to the sensor (i.e., the direction indicated by arrows A in FIG. 1).

Figure 8:
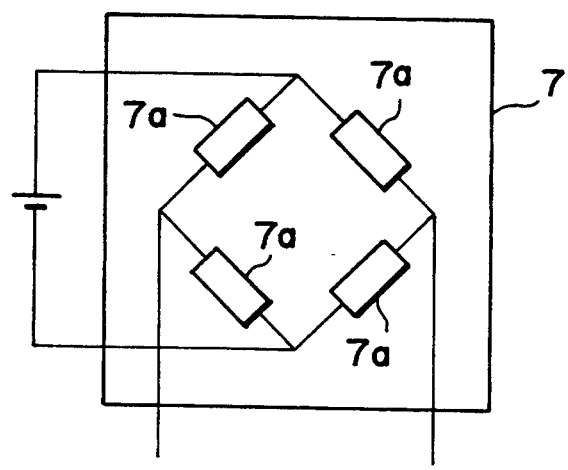
FIG. 8 is a diagram showing the circuit configuration of a strain gauge of the conventional sensor.

The pressure sensor operates in the following manner. When a metal diaphragm 2 of the pressure sensor is subjected to an external pressure acting thereon in the direction indicated by arrows A, the pressure is transmitted from the metal diaphragm 2 through a non-compressible medium 3 to the semiconductor pressure-sensing unit 6. When the semiconductor pressure-sensing unit 6 receives the transmitted pressure, the semiconductor diaphragm 6a undergoes a deformation in accordance with the magnitude of the pressure. The strain gauge 11 senses the deformation of the semiconductor diaphragm 6a, and outputs an electrical signal indicating the magnitude of that deformation. The wires 8 and the leads 9 deliver the electrical signal to an external device (not shown). Accordingly, the external device is able to recognize the magnitude of the external pressure on the basis of the electrical signal output from the strain gauge 11. The strain gauge 11 may have a circuit configuration similar to that shown in FIG. 8.

Even when intense vibration acts on the pressure sensor, since the wires 8 are within the coverage of the electrically insulating material 10 forming the molding portion, detection of pressure can be performed without being influenced by vibration, that is, without being hindered by disconnection or the like.

Figure 2:
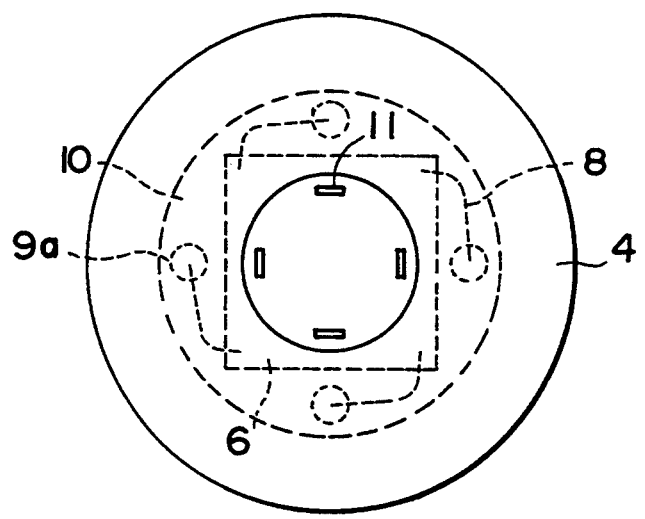
FIG. 2 is a plan view schematically showing a metal diaphragm of the sensor shown in FIG. 1.

FIG. 2 schematically shows, in a plan view, the metal diaphragm 2 of the sensor shown in FIG. 1. As shown in FIG. 2, the electrically insulating material 10 (indicated by broken lines) covers the relevant portions of the semiconductor pressure-sensing unit 6, the wires 8, and those portions 9a of the leads 9 connected with the wires 8. The strain gauge 11 is not covered by the electrically insulating material 10 but exposed to enable detection of pressure.

Although, in FIG. 2, the electrically insulating material 10 is so shaped as to have circular inner- and outer-peripheral portions, this is a mere example, and the electrically insulating material 10 may have another various shapes, such as a rectangular shape.

With the pressure sensor having the above-described arrangement, the wires 8 are protected by the electrically insulating material 10 even when the sensor is used in an intense-vibration environment, thereby making it possible to prevent disconnection or separation of the wires 8 and the leads 9. Hence, it is possible to perform pressure detection even in an intense-vibration environment. The provision of the electrically insulating material 10 is also advantageous in that the volume of the space within the body casing 1 is reduced by an amount corresponding to the volume of the electrically insulating material 10, thereby making it possible to reduce influences caused by changes in temperature, such as thermal expansion of the non-compressible medium 3.

Figure 3:
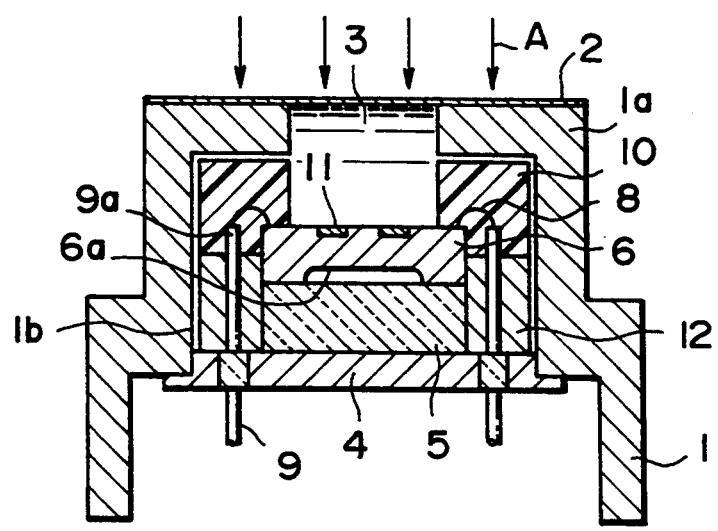
FIG. 3 is a vertical sectional view schematically showing a pressure sensor according to a second embodiment of the present invention.

FIG. 3 schematically shows, in a vertical sectional view, a pressure sensor according to a second embodiment of the present invention. In FIG. 3, components which are the same as or correspond to those of the first embodiment are denoted by identical reference numerals. Referring to FIG. 3, the sensor according to this embodiment includes a spacer 12 provided on a sealing member 4 in such a manner as to contact the respective peripheries of a base 5, upper portions 9a of leads 9, and a semiconductor pressure-sensing unit 6. Also, an electrically insulating material 10 forming a molding portion is retained on the spacer 12, and covers wires 8 themselves, the joints between the wires 8 and the semiconductor pressure-sensing unit 6, and the joints between the wires 8 and the leads 9.

The spacer 12 is made of an electrically insulating material. However, since the spacer 12 is disposed contacting both the electrically insulating material 10 and the semiconductor pressure-sensing unit 6 made of silicon or the like, the spacer 12 is made of an electrically insulating material having a coefficient of linear expansion close to that of the semiconductor pressure-sensing unit 6.

Figure 4:
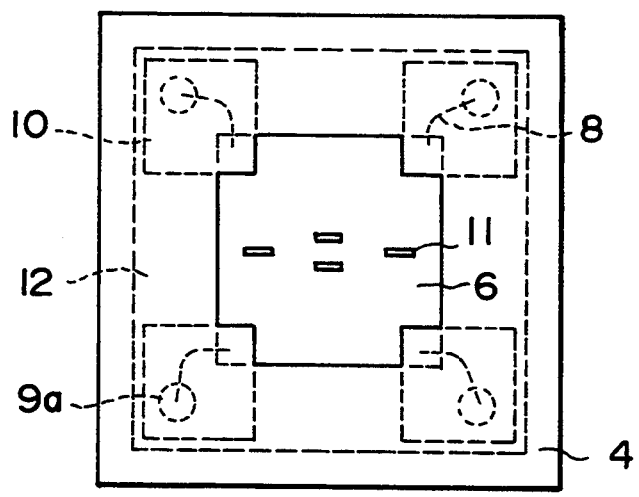
FIG. 4 is a plan view schematically showing a metal diaphragm of the sensor shown in FIG. 3.

FIG. 4 schematically shows, in a plan view, a metal diaphragm 2 of the sensor shown in FIG. 3. As shown in FIG. 4, a strain gauge 11 is exposed from the electrically insulating material 10 to enable detection of pressure.

The insulating material 10, may contract by a relatively great degree when subjected to changes in temperature, and is thus capable of contracting by a greater amount than a semiconductor pressure-sensing unit 6 contracting upon the same changes in temperature. Since the spacer 12 is made of a material having a coefficient of linear expansion close to that of the semiconductor pressure-sensing unit 6, the spacer 12 is able to act to mitigate the resultant difference in thermal stress between the base 5 and the semiconductor pressure-sensing unit 6. Thus, it is possible to reduce influences on the strain gauge 11 caused by changes in temperature, and hence, to provide a pressure sensor with high reliability.

Although, in FIG. 4, the molding portion formed by the electrically insulating material 10 is divided into a plurality of (e.g., four) sections individually covering corresponding ones of a plurality of (e.g., four) wires 8 and corresponding upper portions 9a of the leads 9, it is not necessary to form such individual sections. Further, although in FIG. 4, both the spacers 12 and the molding portion formed by the electrically insulating material 10 have rectangular outer peripheries, this is a mere example, and they may alternatively have circular or polygonal peripheries.

Figure 5:
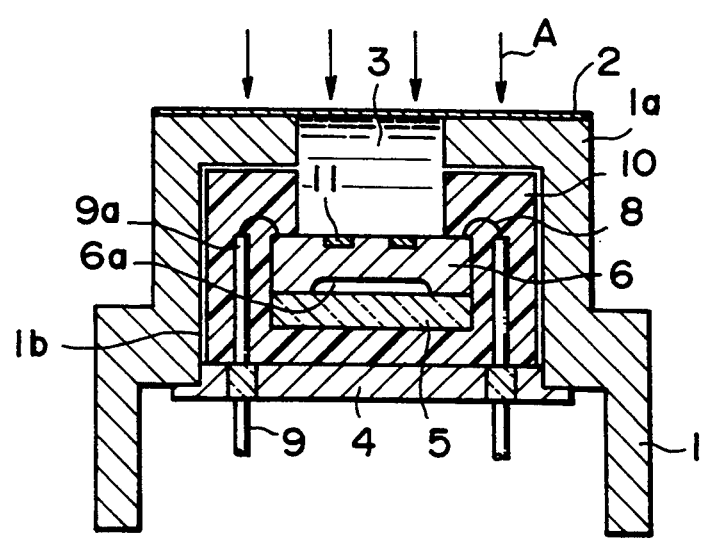
FIG. 5 is a vertical sectional view schematically showing a pressure sensor according to a third embodiment of the present invention.

FIG. 5 schematically shows, in a vertical sectional view, a pressure sensor according to a third embodiment of the present invention. In FIG. 5, components which are the same as or correspond to those of the first embodiment are denoted by identical reference numerals. Referring to FIG. 5, the sensor according to this embodiment includes an electrically insulating material 10 forming a molding portion and covering wires 8 themselves, the joints between the wires 8 and a semiconductor pressure-sensing unit 6, and the joints between the wires 8 and leads 9. The embodiment is distinguished from the other embodiments in that the electrically insulating material 10 also covers the base 5 in such a manner that the base 5 is included in the coverage of the molding portion.

With the sensor shown in FIG. 5, it is possible to prevent disconnection or separation of the wires 8 and the leads 9 even in an intense-vibration environment, which in turn makes it possible to deliver variations in the electrical signal of the strain gauge 11 to the associated external device, thus enabling the provision of a highly reliable pressure sensor. Since the volume of the space inside the body casing 1 can be reduced by an amount corresponding to the volume of the electrically insulating material 10, it is possible to reduce influences caused by changes in temperature, such as thermal expansion of a non-compressible medium 3.

Figure 6:
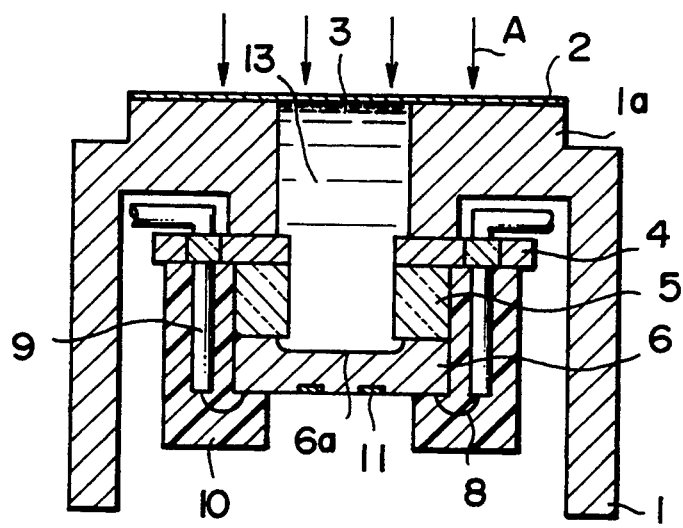
FIG. 6 is a vertical sectional view schematically showing a pressure sensor according to a fourth embodiment of the present invention.
Figure 7:
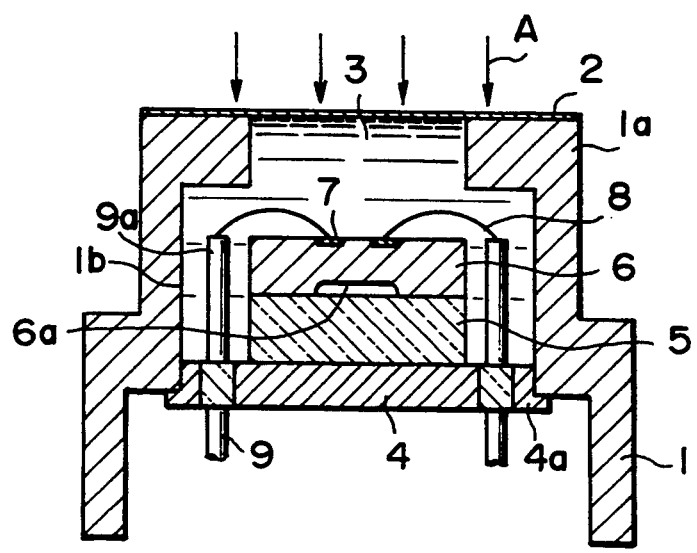
FIG. 7 is a vertical sectional view schematically showing a conventional pressure sensor.

FIG. 6 schematically shows, in a vertical sectional view, a pressure sensor according to a fourth embodiment of the present invention. In FIG. 6, components which are the same as or correspond to those of the first embodiment are denoted by identical reference numerals. Referring to FIG. 6, the sensor according to this embodiment includes a pressure introduction hole 13 formed through a sealing member 4 and a base 5, and is constructed such that pressure acts on that surface of a semiconductor diaphragm 6a of a semiconductor pressure-sensing unit 6 which diaphragm is not provided with a strain gauge 11 of the unit 6. Similarly to the first embodiment, an electrically insulating material 10 forming a molding portion covers wires 8 themselves, the joints between the wires 8 and the semiconductor pressure-sensing unit 6, and the joints between the wires 8 and leads 9.

Thus, the present invention is applicable to a pressure sensor of the type constructed to receive pressure on that surface of the semiconductor diaphragm 6a which is not provided with the strain gauge 11, and, even in this case, effects similar to those described above are provided. In this case, the electrically insulating material 10 may cover the wires 8 and only those portions of the leads 9 and the semiconductor pressure-sensing unit 6 which are in the vicinity of the wires 8.

Thus, according to the present invention, it is possible to provide a pressure sensor capable of detecting pressure even in an intense-vibration environment.

When the pressure sensor includes a spacer which, around the semiconductor pressure-sensing unit of the sensor, supports an electrically insulating material, it is possible to provide a pressure sensor capable of detecting pressure even in an intense-vibration environment, and capable of reducing influences by changes in temperature.

What is claimed is:

1. A pressure sensor comprising:
   a body casing having an opening portion formed with an opening therethrough;
   a metal diaphragm sealed on the outer end of said opening portion of said body casing, said metal diaphragm being capable of deforming when subjected to pressure from the outside of said pressure sensor;
   a non-compressible medium sealed contacting inner surfaces of said body casing;
   a sealing member cooperating with said metal diaphragm to seal the inside of said body casing;
   a base mounted on said sealing member;
   a semiconductor pressure-sensing unit mounted on said base, said semiconductor pressure-sensing unit having a semiconductor diaphragm for receiving pressure through said non-compressible medium when said metal diaphragm deforms, and for deforming in accordance with the received pressure, said semiconductor pressure-sensing unit also having a strain gauge for outputting an electrical signal indicating such a deformation of said semiconductor diaphragm;
   wires for transmitting an electrical signal from said semiconductor pressure-sensing unit;
   leads connected with said wires for leading the electrical signal to the outside of said body casing of said sensor;
   an electrically insulating material covering said wires per se, the joints between said wires and said semiconductor pressure-sensing unit, and the joints between said wires and said leads; and
   a spacer provided between said electrically insulating material and said sealing member.

2. The pressure sensor according to claim 1, wherein said spacer comprises insulating material.

3. The pressure sensor according to claim 1, wherein said spacer comprises an insulation material having a linear coefficient of thermal expansion substantially similar to that of the semiconductor pressure-sensing unit.

4. The pressure sensor according to claim 1, wherein said electrically insulating material mitigates pressure transients sensed by said pressure-sensing unit responsive to thermal expansion of said non-compressible medium.

5. The pressure sensor according to claim 1, wherein said strain gauge is not contacted by said electrically insulating material.

6. The pressure sensor according to claim 1, wherein said insulating material has a first coefficient of linear expansion and wherein said spacer has a second coefficient of linear expansion substantially similar to that of said pressure-sensing unit and wherein said first coefficient is different from said second coefficient of linear expansion.

7. A pressure sensor comprising:
a body casing having an opening portion formed with an opening therethrough;
a metal diaphragm sealed on the outer end of said opening portion of said body casing, said metal diaphragm being capable of deforming when subjected to pressure from the outside of said pressure sensor;
a sealing member disposed on the inner end of said opening portion of said body casing and opposed to said metal diaphragm, said sealing member having an opening therethrough;
a base disposed on said sealing member and having an opening formed therethrough;
a semiconductor pressure-sensing unit having a semiconductor diaphragm on one side thereof and a strain gauge on the other, said semiconductor pressure-sensing unit being disposed on said base with said semiconductor diaphragm opposed to said metal diaphragm;
a non-compressible medium sealed contracting inner surfaces of said body casing in a space defined by said metal diaphragm, said body casing, respective openings of said sealing member and said base, and said pressure sensing unit;
wires for transmitting an electrical signal from said semiconductor pressure-sensing unit;
leads connected with said wires for leading the electrical signal away from said sensor; and
an electrically insulating material covering said wires per se, the joints between said wires and said semiconductor pressure-sensing unit, and the joints between said wires and said leads.

8. A pressure sensor comprising:
a body casing having an opening portion formed with an opening therethrough;
a metal diaphragm sealed on the outer end of said opening portion of said body casing, said metal diaphragm being capable of deforming when subjected to pressure from the outside of said pressure sensor;
a non-compressible medium sealed contacting inner surfaces of said body casing;
a sealing member cooperating with said metal diaphragm to seal the inside of said body casing;
a base mounted on said sealing member;
a semiconductor pressure-sensing unit mounted on said base, said semiconductor pressure-sensing unit having a semiconductor diaphragm for receiving pressure through said non-compressible medium when said metal diaphragm deforms, and for deforming in accordance with the received pressure, said semiconductor pressure-sensing unit also having a strain gauge for outputting an electrical signal indicating such a deformation of said semiconductor diaphragm;
wires for transmitting an electrical signal from said semiconductor pressure-sensing unit;
leads connected with said wires for leading the electrical signal to the outside of said body casing of said sensor; and
an electrically insulating material covering said wires per se, the joints between said wires and said semiconductor pressure-sensing unit, and the joints between said wires and said leads,
wherein said electrically insulating material is provided between said sealing member and said base, and covers said base in such a manner as to include said base in the coverage of said electrically insulating material.

9. The pressure sensor according to claim 8, wherein said electrically insulating material fixedly connects said base to said sealing member.

* * * * *